United States Patent
Huang et al.

(10) Patent No.: US 9,245,945 B1
(45) Date of Patent: Jan. 26, 2016

(54) SEMICONDUCTOR DEVICE HAVING WEAK CURRENT CHANNEL

(71) Applicants: Tsung-Yi Huang, Hsinchu (TW); Chien-Wei Chiu, Yunlin (TW); Huang-Ping Chu, Hsinchu (TW); Chien-Kai Chang, Miaoli (TW)

(72) Inventors: Tsung-Yi Huang, Hsinchu (TW); Chien-Wei Chiu, Yunlin (TW); Huang-Ping Chu, Hsinchu (TW); Chien-Kai Chang, Miaoli (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 14/534,955

(22) Filed: Nov. 6, 2014

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/06 | (2006.01) | |
| H01L 29/78 | (2006.01) | |

(52) U.S. Cl.
CPC ........ *H01L 29/0634* (2013.01); *H01L 29/0688* (2013.01); *H01L 29/7816* (2013.01); *H01L 29/7833* (2013.01)

(58) Field of Classification Search
CPC ............ H01L 29/7835; H01L 29/7816; H01L 29/66659; H01L 29/1095; H01L 29/66681; H01L 29/0634; H01L 29/7801; H01L 29/7833; H01L 29/0688
USPC .......... 257/335, 328, 492, E29.256, E29.268, 257/E21.417, E21.427, E29.027, E29.066, 257/E29.261, 336
See application file for complete search history.

(56) References Cited

U.S. PATENT DOCUMENTS

| | | | | |
|---|---|---|---|---|
| 2012/0104492 A1* | 5/2012 | Chu | ................... | H01L 29/0634 257/335 |
| 2012/0217579 A1* | 8/2012 | Huang | ................ | H01L 29/0634 257/335 |
| 2012/0280316 A1* | 11/2012 | Lin | ................... | H01L 29/66689 257/335 |
| 2014/0008723 A1* | 1/2014 | Lin | ..................... | H01L 29/0634 257/336 |
| 2015/0214361 A1* | 7/2015 | Chan | ................ | H01L 29/66681 257/339 |

* cited by examiner

*Primary Examiner* — Thien F Tran
(74) *Attorney, Agent, or Firm* — Tung & Associates

(57) ABSTRACT

The invention provides a semiconductor device having a weak current channel. The semiconductor device includes a gate, a source and a drain. There are a plurality of insulation layers and a plurality of first conductive type lightly doped regions alternatingly arranged between the gate and the drain; each of the first conductive type lightly doped regions providing a weak current channel between the source and the drain. When the gate is in a relatively low voltage range, the weak current channel is conducted; when the gate is in a relatively high voltage range, the weak current channel is not conducted.

5 Claims, 4 Drawing Sheets

SEMICONDUCTOR DEVICE HAVING WEAK CURRENT CHANNEL

BACKGROUND OF THE INVENTION

1. Field of Invention

The present invention relates to a semiconductor device having a weak current channel, in particular a semiconductor device including a weak current channel provided through a first conductive type lightly doped region when the gate of the semiconductor device is in a relatively low voltage range.

2. Description of Related Art

FIGS. 1A and 1B show a prior art semiconductor device 10 which is a double resurf field effect transistor, wherein FIG. 1B is a cross section view according to the cross section line AA' in FIG. 1A. The semiconductor device 10 includes a substrate SUB and a first conductive type well NW on the substrate SUB. Please refer to FIG. 1B (from left to right), a second conductive type body PBOBY, a source S, an insulation layer FOX, and a drain D are located in the first conductive type well NW. A second conductive type well PTOP is under the insulation layer FOX. The semiconductor device 10 further includes a gate G located above the substrate SUB, a portion of the gate G being on a gate oxide GOX and another portion of the gate G being on the insulation layer FOX.

A control voltage supplied to the gate G controls the current between the source S and drain D, and the current flows through a current channel Ch between the source S and the drain D as shown in FIG. 1B. By the double resurf effect, the current channel Ch has a longer distance, so the semiconductor device 10 is capable of operating under high voltage. However, when the control voltage is in a low voltage range, the conduction resistance is relatively higher, which may possibly cause an operation failure such as off-conduction when the device should be in conduction. Thus, although the semiconductor device 10 can operate under high voltage, it has poor performance in the low voltage range.

Therefore, the present invention provides a semiconductor device to solve the aforementioned problem.

SUMMARY OF THE INVENTION

According to one perspective of the present invention, a semiconductor device having a weak current channel is provided. The semiconductor device includes: a substrate; a first conductive type well on the substrate, wherein a source, a second conductive type well, and a drain are formed in the first conductive type well; a plurality of insulation layers and a plurality of first conductive type lightly doped regions, alternatingly arranged along a first direction on or above the second conductive type well, each of the insulation layers including a first end relatively closer to the source and a second end relatively closer to the drain along a second direction, and each of the first conductive type lightly doped regions including a first end relatively closer to the source and a second end relatively closer to the drain along the second direction, wherein the first direction and the second direction intersect with each other; and a gate, relatively closer to the first ends of the insulation layers than the second ends of the insulation layers, a portion of the gate being on a gate oxide above the first conductive type well, and another portion of the gate being on the insulation layers; wherein each of the first conductive type lightly doped regions provides a weak current channel between the source and the drain.

In one embodiment of the present invention, when the gate is in a relatively low voltage range, the weak current channel is conducted; when the gate is in a relatively high voltage range, the weak current channel is not conducted.

In one embodiment of the present invention, the first end of the first conductive type lightly doped region is not in contact with a near end of the gate, and there is a gap between the first end of the first conductive type lightly doped region and the near end of the gate.

In one embodiment of the present invention, the second end of the first conductive type lightly doped region is in contact with the drain.

In one embodiment of the present invention, the second end of the first conductive type lightly doped region is not in contact with a near end of the drain, and there is a gap between the second end of the first conductive type lightly doped region and the near end of the drain.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, to show the interrelations between the layers or regions, but not drawn according to actual scale.

Figure 1A:
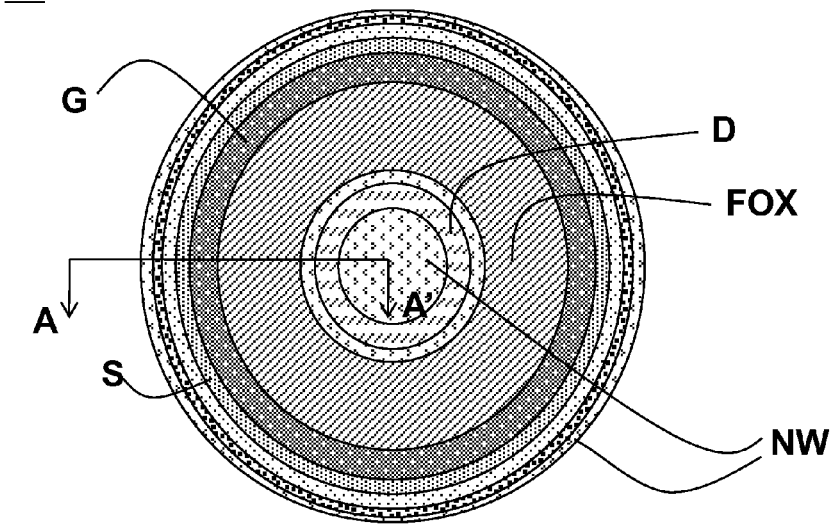
FIGS. 1A and 1B show a prior art semiconductor device.
Figure 1B:
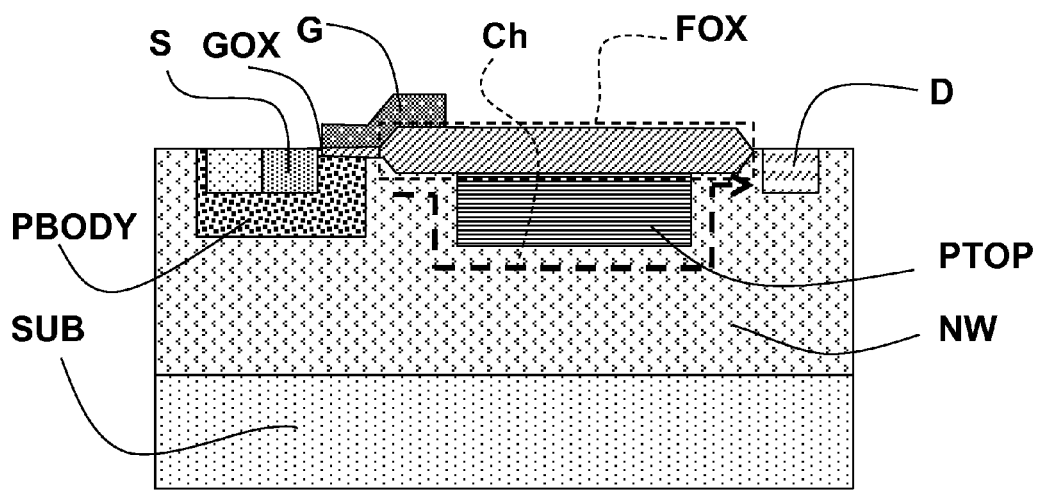
Figure 2A:
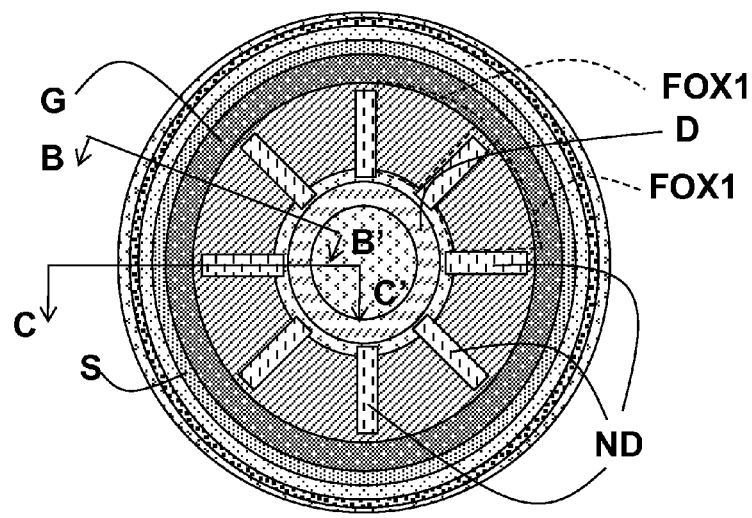
FIGS. 2A, 2B, and 2C show a semiconductor device according to one embodiment of the present invention.
Figure 2B:
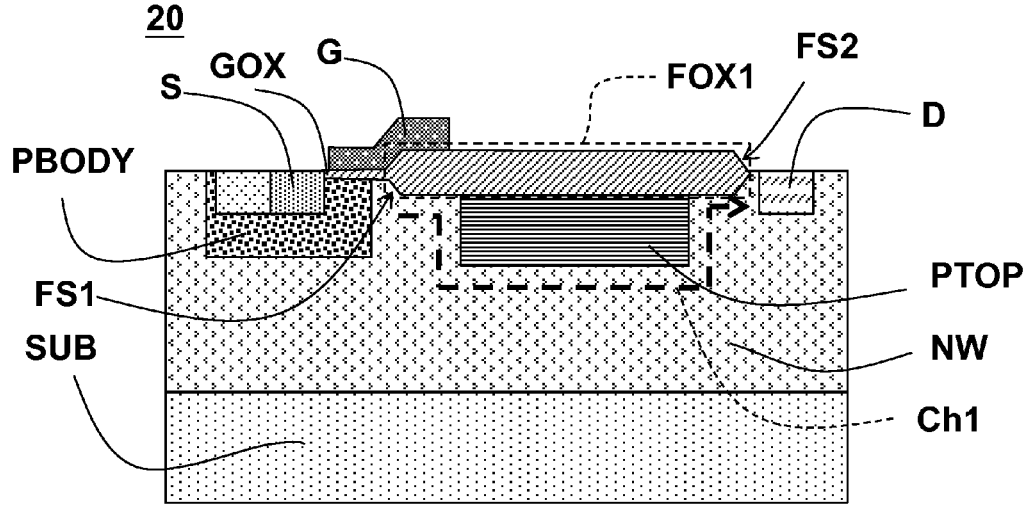
Figure 2C:
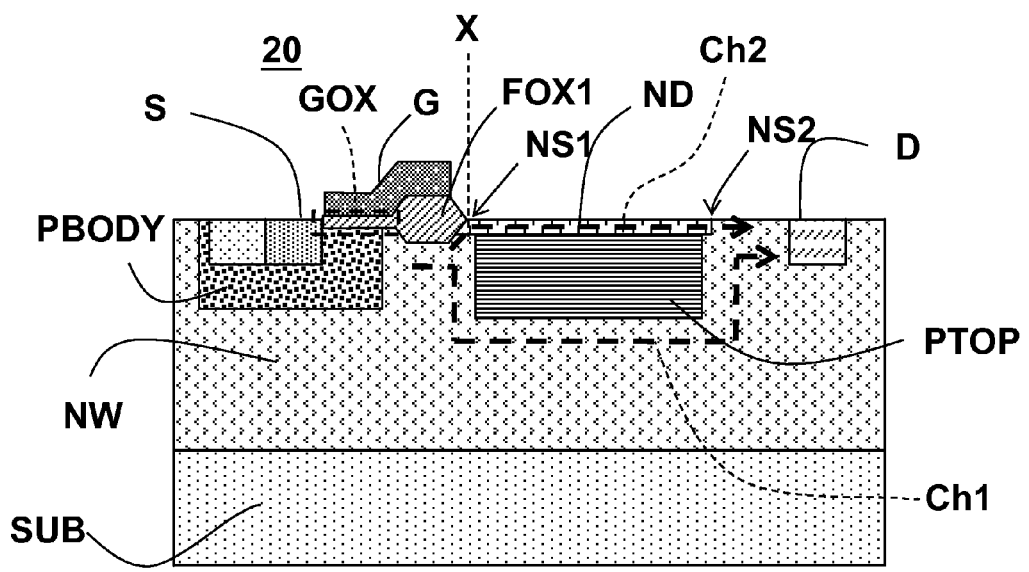

FIGS. 2A-2C show a semiconductor device 20 according to one embodiment of the present invention, wherein FIG. 2A is a top view, FIG. 2B is a cross section view according to a cross section line BB' in FIG. 2A, and FIG. 2C is a cross section view according to a cross section line CC' in FIG. 2A. This embodiment is different from the prior art semiconductor device 10 in FIGS. 1A-1B in that the insulation layer FOX in the prior art semiconductor device 10 is a continuous structure, while there are plural insulation layers FOX1 in the semiconductor device 20 of the present invention, and plural first conductive type lightly doped regions ND are provided between the insulation layers FOX1. The semiconductor device 20 includes a substrate SUB; a first conductive type well NW on the substrate SUB, wherein a source S, a second conductive type well PTOP, and a drain D are formed in the first conductive type well NW; plural insulation layers FOX1 and plural first conductive type lightly doped regions ND, arranged in an alternating manner along a first direction (the circular direction surrounding the axial direction of the semiconductor device 20 in this embodiment) on or above the second conductive type well PTOP, wherein each of the insulation layers FOX1 includes a first end FS1 relatively closer to the source S and a second end FS2 relatively closer to the drain D along a second direction (the radial direction in this embodiment), and each of the first conductive type lightly doped regions ND includes a first end NS1 relatively closer to the source S and a second end NS2 relatively closer to the drain D along the second direction; and a gate G relatively closer to the first ends FS1 of the insulation layers than the second ends FS2 of the insulation layers, a portion of the gate G being on a gate oxide GOX above the first conductive type well NW, another portion of the gate G being on the insulation layers FOX1, wherein the first direction and the second direction intersect with each other.

As shown in FIGS. 2B and 2C, there are a strong current channel Ch1 and a weak current channel Ch2 between the source S and the drain D. When the gate G is in a relatively high voltage range (for example, a typical operation range designed for the semiconductor device 20), the weak current channel Ch2 is not conducted due to the depletion effect; the current flows from the source S to the drain D through the strong current channel Ch1 but not through the weak current channel Ch2. When the gate is in a relatively low voltage range to turn ON the device (for example, in a voltage range lower than the aforementioned typical operation range but still within a reasonable working range), besides the strong current channel Ch1, the weak current channel Ch2 is provided in the first conductive type lightly doped region ND as another current channel between the source S and the drain D, for reducing the conduction resistance and avoiding the possible operation failure. The weak current channel Ch2 exists only when the gate G is in the relatively low voltage range, so the characteristics of the device in normal operation, such as the breakdown voltage, is not affected by the weak current channel Ch2. Note that "relatively high voltage range" and "relatively low voltage range" are relative definitions which depend on the device design. A device designer can adjust the threshold voltage of the gate G for conducting the weak current channel Ch2 by adjusting the layout, implementation concentration, thickness, etc. of the device.

Moreover, the aforementioned first conductive type is for example N type and the aforementioned second conductive type is for example P type; that is, the first conductive type lightly doped region ND can be an N type lightly doped region; the first conductive type well NW can be an N type well; the second conductive type well PTOP can be a P type well; and the source S and the drain D can both be N type high concentration doped regions. However, the present invention is not limited to the above example; the first conductive type can be P type and the second conductive type can be N type.

The number of the first conductive type lightly doped regions ND is not limited to the illustrative number shown in the figures. The ratio of the width (or the length of the narrowest arc segment) of the insulation layer FOX1 to the width of the first conductive type lightly doped regions ND is for example in a range from 5:1 to 20:1. A device designer can decide the number and the width of the first conductive type lightly doped regions ND according to this ratio range. In one embodiment, a largest gap between two of the first conductive type lightly doped regions ND is for example but not limited to 1 µm.

Please refer to FIGS. 2A and 2C, wherein the first end NS1 of the first conductive type lightly doped region ND is not in contact with an end of the gate G, and there is a gap between the first end NS1 and the near end of the gate G (the gap includes a bird's beak of the insulation layer FOX1). However, the present invention is not limited to this example; there can either be a gap or no gap between the first end NS1 of the first conductive type lightly doped region ND and the near end of the gate G (for example, the gate G can extend to the line X). In the case that there is a gap, the gap is not limited to the size as shown in the figures.

Figure 3A:
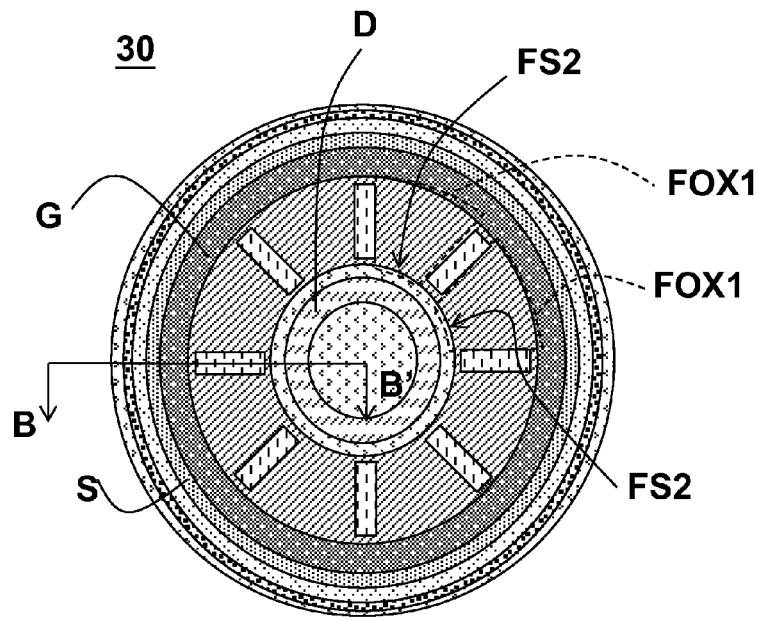
FIGS. 3A and 3B show a semiconductor device according to another embodiment of the present invention.
Figure 3B:
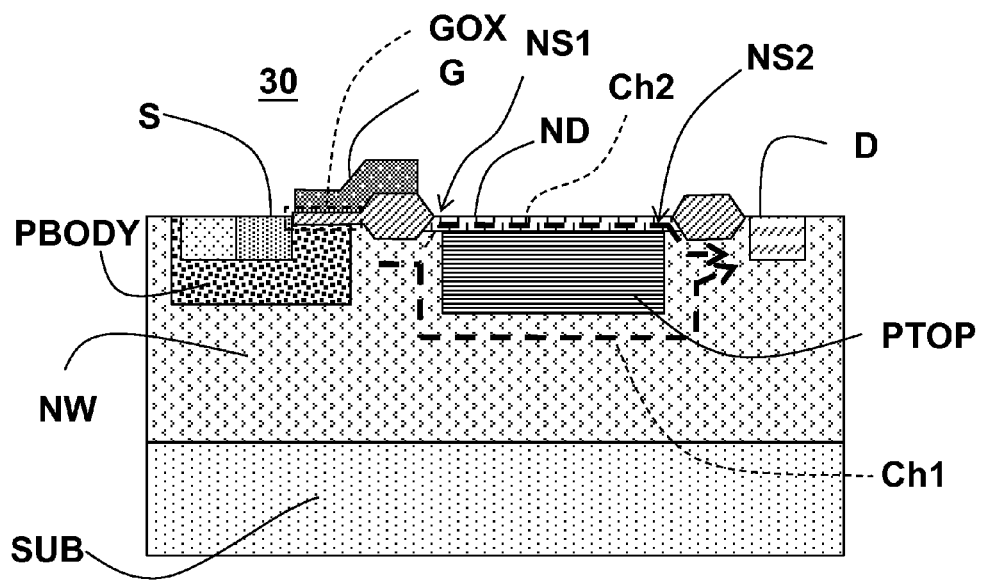

FIGS. 3A-3B show another embodiment of the present invention, wherein FIG. 3B is a cross section view according to a cross section line BB' in FIG. 3A. This embodiment is different from the first embodiment in that, the second end NS2 of the first conductive type lightly doped region ND is not in contact with the drain D, and there is a gap between the second end NS2 of the first conductive type lightly doped region ND and the drain D. The size of the gap can be designed according to practical needs. The gap can lengthen the weak current channel Ch2 to adjust the conduction resistance of and the current amount through the weak current channel Ch2, and also adjust the threshold voltage of the gate G for conducting the weak current channel Ch2. These are the parameters that a designer can decide.

Please refer to FIGS. 2B, 2C, and 3B, the second conductive type well PTOP is for example but not limited to a continuous structure, that is, a continuous circular structure (between the drain D and the source S, and revolving 3601. FIGS. 2A, 3A are top views, so the continuous circular structure is not shown therein. However, the present invention is not limited to the aforementioned continuous structure, and the second conductive type well PTOP for example can be a discontinuous structure.

The semiconductor devices 20 and 30 are illustrated as circular shape from top views. However, the semiconductor device according to present invention is not limited to the circular shape, but can be a different shape such as a rectangular shape, wherein the gate G, the source S and the drain D all extend along a direction perpendicular to the current channel direction. The plural insulation layers FOX1 and the plural first conductive type lightly doped region ND are alternatingly arranged along the perpendicular direction.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. An embodiment or a claim of the present invention does not need to achieve all the objectives or advantages of the present invention. The title and abstract are provided for assisting searches but not for limiting the scope of the present invention.

What is claimed is:

1. A semiconductor device having a weak current channel, comprising:
   a substrate;
   a first conductive type well on the substrate, wherein a source, a second conductive type well, and a drain are formed in the first conductive type well;
   a plurality of insulation layers and a plurality of first conductive type lightly doped regions, alternatingly arranged along a first direction on or above the second conductive type well, each of the insulation layers including a first end relatively closer to the source and a second end relatively closer to the drain along a second direction, and each of the first conductive type lightly doped regions including a first end relatively closer to the source and a second end relatively closer to the drain along the second direction, wherein the first direction and the second direction intersect with each other; and
   a gate, relatively closer to the first ends of the insulation layers than the second ends of the insulation layers, a portion of the gate being on a gate oxide above the first conductive type well, and another portion of the gate being on the insulation layers;
   wherein each of the first conductive type lightly doped regions provides a weak current channel between the source and the drain.

2. The semiconductor device having a weak current channel of claim 1, wherein when the gate is in a relatively low voltage range, the weak current channel is conducted; when the gate is in a relatively high voltage range, the weak current channel is not conducted.

3. The semiconductor device having a weak current channel of claim 1, wherein the first end of the first conductive type lightly doped region is not in contact with a near end of the gate, and there is a gap between the first end of the first conductive type lightly doped region and the near end of the gate.

4. The semiconductor device having a weak current channel of claim 3, wherein the second end of the first conductive type lightly doped region is in contact with the drain.

5. The semiconductor device having a weak current channel of claim 1, wherein the second end of the first conductive type lightly doped region is not in contact with a near end of the drain, and there is a gap between the second end of the first conductive type lightly doped region and the near end of the drain.

\* \* \* \* \*